(12) United States Patent
Ohannaidh

(10) Patent No.: US 7,109,786 B2
(45) Date of Patent: Sep. 19, 2006

(54) BIQUAD NOTCH FILTER

(75) Inventor: Eoin Ohannaidh, Brignoud (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/051,243

(22) Filed: Feb. 3, 2005

(65) Prior Publication Data

US 2005/0189987 A1     Sep. 1, 2005

(30) Foreign Application Priority Data

Feb. 4, 2004     (EP)     ................................ 04290295

(51) Int. Cl.
*H03K 5/00*     (2006.01)

(52) U.S. Cl. ...................................... 327/556; 327/552
(58) Field of Classification Search ......... 327/552–559
See application file for complete search history.

(56) References Cited

U.S. PATENT DOCUMENTS

| | | | |
|---|---|---|---|
| 3,501,709 A * | 3/1970 | Uetrecht | 330/303 |
| 3,550,027 A * | 12/1970 | Uetrecht | 330/291 |
| 4,524,332 A | 6/1985 | Gay | 330/294 |
| 6,407,627 B1 * | 6/2002 | Martin | 327/552 |

OTHER PUBLICATIONS

Contreras, R., "Generating all Possible Transfer Functions from Known Active Filter Topologies," in *Proceedings of the Intl. Symposium on Circuits and Systems*, New York, May 3, 1992, vol. 4, conf. 25, pp. 827-830.

Su, P-U., et al., "A Dual-band Enhanced Harmonic Rejection Filter for Modulators in GSM and DCS Transmitters," in *Proceedings of the European Solid-State Circuits Conference*, Sep. 16, 2003, pp. 663-666.

* cited by examiner

*Primary Examiner*—Dinh T. Le
(74) *Attorney, Agent, or Firm*—Lisa K. Jorgenson; Robert Iannucci; Seed IP Law Group PLLC

(57) ABSTRACT

A biquad notch filter includes a first stage having first and second admittances of a first type connected between an input terminal and the control terminal of a transistor, a first current source connected between a first supply terminal and a first terminal of the transistor, a second current source connected between a second terminal of the transistor and a second supply terminal; a third admittance of a second type connected between the control terminal and the second supply terminal, a fourth admittance of a second type connected between the first admittance and the second terminal; and a second stage having a transconductance, including a fifth admittance of the first type, connected between the control terminal and an output terminal, a sixth admittance of the first type connected between the output terminal and the second supply terminal, and a connection of the first terminal to the output terminal.

32 Claims, 3 Drawing Sheets

ást # BIQUAD NOTCH FILTER

BACKGROUND OF THE INVENTION

1. Field of the Invention

The present invention relates generally to electrical filters and in particular to electrical notch filters.

2. Description of the Related Art

A notch filter is a band elimination or band stop filter, for attenuating or damping a part of a frequency band centered on a center frequency. Stated otherwise, the amplitude response of a notch filter is flat at all frequencies except for the stop band on either side of the center frequency. The drastic attenuation of the filter response around the targeted frequency is called the notch.

Notch filters have been used for years in the signal processing of signals in a reverberant or high clutter background. A biquad notch filter is a notch filter with a two pole and two zero filter topology, i.e. with a s-domain transfer function with 2 as the highest exponent both in the numerator or denominator. Such a filter is characterized by the 2 poles and 2 zeros of its transfer function. The zeroes are directly linked to the band elimination capacities of the biquad notch filter.

Commonly used biquad notch filters require a lot of operational amplifiers (OP-Amp), resulting in complex circuit architectures and high current consumptions. They can also display very large components ratios, with subsequent matching difficulties, i.e. pole positioning.

Several known biquad notch filters are shown in the book "Analog Filter Design" by Van Valkenburg. The 4-OP-Amp biquad circuit, presented on page 136, for example, presents a high current consumption and its zero placement is not independent of the pole placement, as they are equal in magnitude. The Bainter circuit, found in Van Valkenburg's, page 348, also shows a high current consumption with its 3 Op-Amps. The Boctor circuit, on page 350 of Van Valkenburg's, with its 8 elements, offers considerable latitude in the choice of element sizes, though it still requires careful matching between elements to control zero positioning. The ratio between elements can be very large. The derivation of the Friend circuit, in Van Valkenburg's page 358 is only applicable for when the zero's magnitude is greater than the pole's magnitude. It is characterized by a very large resistor ratio, and presents attenuation at low frequencies.

BRIEF SUMMARY OF THE INVENTION

One embodiment of the present invention provides a biquad notch filter.

In said biquad notch filter, the zero placement is independent of the pole placement and the poles and zeros are relatively simple functions of circuit elements. The capacitance and/or resistor ratios are not too large, and the circuit can be used both for when the zero's magnitude is greater or less than the pole's magnitude. No Op-Amps are required, thus avoiding loop-stability problems and making it suitable for high-frequency applications. Instead, the biquad notch filter employs a follower and a single GM cell. Thus this solution is relatively simple and very power-efficient.

BRIEF DESCRIPTION OF THE SEVERAL VIEWS OF THE DRAWINGS

The objects and features of the present invention will become more apparent from the consideration of the following detailed description of an exemplary embodiment taken in conjunction with the accompanying drawings, in which:

FIG. 5($b$) is a diagram showing the frequency response of a first biquad notch filter according to the invention, using a first chosen set of pole and zero magnitudes, and corresponding to the second notch of FIG. 5($a$); and, FIG. 5($c$) is a diagram showing the frequency response of a second biquad notch filter according to the invention, using a second chosen set of pole and zero magnitudes, and corresponding to the first notch of FIG. 5($a$).

On the different figures, the same elements carry the same reference numbers.

DETAILED DESCRIPTION OF THE INVENTION

Figure 1:
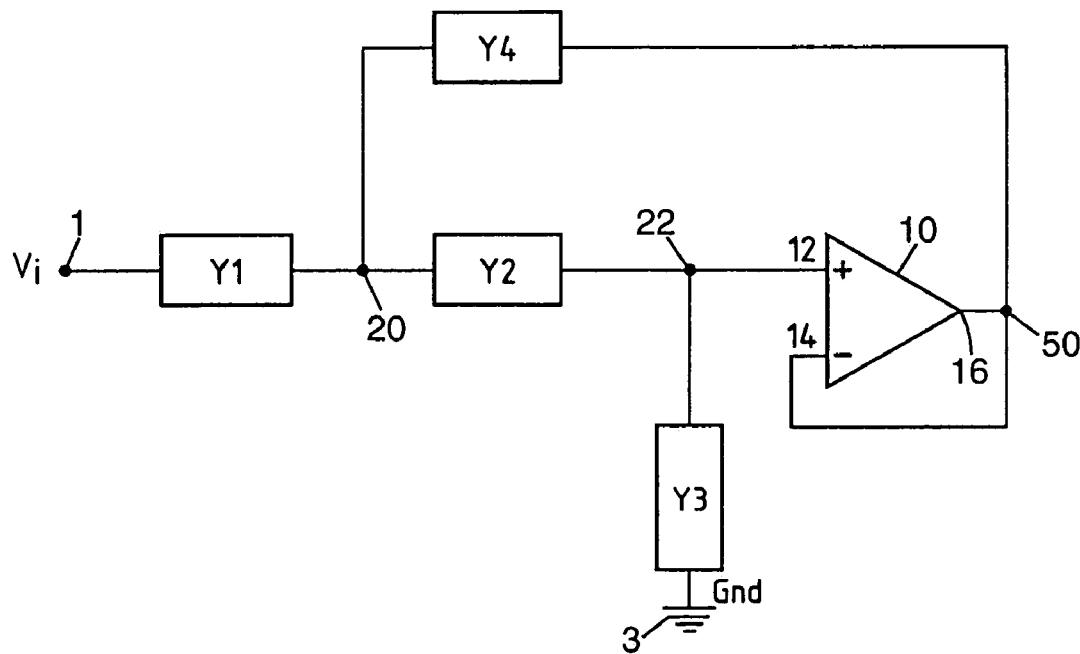
FIG. 1 is a schematic circuit diagram of a conventional Sallen-Key filter circuit.

FIG. 1 illustrates a typical Sallen-Key filter circuit. The circuit comprises an operational amplifier 10 connected in unity gain. It has positive and negative input terminals 12, 14 and an output terminal 16 connected to the negative input 14. First and second admittance Y1 and Y2 are connected in series between the input Vi of the circuit and the positive input terminal 12 of the amplifier 10. A third admittance Y3 is connected between one terminal 22 of the second admittance Y2 and the ground 3, or any AC ground node for that matter. A fourth admittance Y4 is connected between a junction 20 between the two first admittances and the output terminal 16 of the amplifier. Naming V22 the output signal on node 22 of FIG. 1 and Vi the input signal on node 1, the Sallen-Key filter circuit yields the following relationship (1.1):

$$\frac{V22}{Vi} = \frac{Y_1 Y_2}{Y_1 Y_2 + Y_3(Y_1 + Y_2) + Y_3 Y_4} \qquad (1.1)$$

and the input admittance is given by the following equation (1.2):

$$Y_i = \frac{Y_1 Y_3 (Y_2 + Y_4)}{Y_1 Y_2 + Y_3(Y_1 + Y_2) + Y_3 Y_4} \qquad (1.2)$$

In a common realization of the Sallen-Key circuit, Y1 and Y2 are of a first type, while Y3 and Y4 are of a second type. For example, Y1 and Y2 are both resistors while Y3 and Y4 are both capacitances. These two types of admittances can also be swapped.

Figure 2:
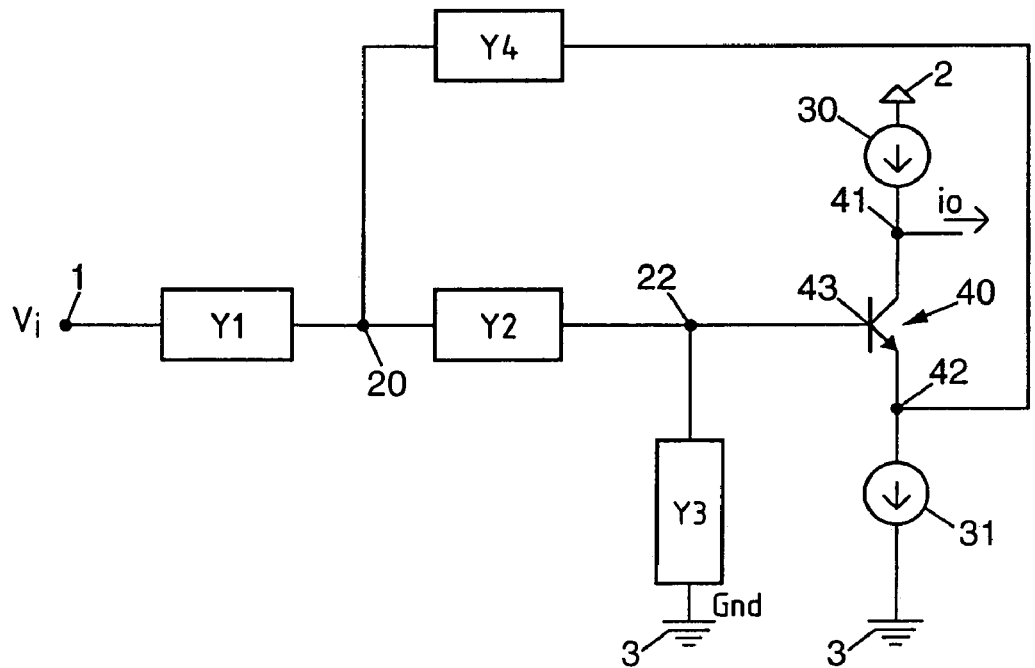
FIG. 2 is a schematic circuit diagram of a modified Sallen-Key filter circuit.

The advantage of the Sallen-Key architecture is its simplicity. The Amp-Op in unity gain arrangement can be replaced by a follower transistor, as shown in FIG. 2. In this figure, the Amp-Op 10 of FIG. 1 is replaced by a follower transistor 40 between the admittance Y4 and node 22. The follower transistor comprises two main terminals 41 and 42 and one control terminal 43. Admittance Y4 is connected to the second main terminal 42 of the follower transistor. Two current sources 30 and 31 have been added. The first one 30 is connected between a first power supply terminal 2 and the first main terminal 41 of the follower transistor, while the second one 31 is connected between the second main terminal 42 of the follower transistor and a second power supply terminal, here the ground 3. Both current sources could deliver the same current, though they could also be used to correct direct current (DC) offsets at the biquad filter output.

The follower transistor itself can be a bipolar transistor, either of the NPN or PNP type. It could also be a MOS transistor. In the examples shown hereafter, the follower transistor 40 is an NPN transistor. Thus the control terminal 43 of the NPN transistor is the base, its first main terminal 41 is the collector and its second main terminal 42 is the emitter. The first power supply terminal delivers a positive DC voltage Vdd, and the second power supply terminal is ground.

If a PNP transistor is chosen, the base, the collector and the emitter of the transistor correspond to the same terminals as for an NPN transistor, while the first power supply terminal is ground, and the second power supply terminal delivers a positive DC voltage Vdd. If a MOS transistor is chosen, the control terminal 43 of the MOS transistor is the gate, its first main terminal 41 is the drain and its second main terminal 42 is the source. The first power supply terminal of an NMOS transistor delivers a positive DC voltage Vdd, and the second power supply terminal is ground. The first power supply terminal of a PMOS transistor is ground, and the second power supply terminal delivers a positive DC voltage Vdd. The man skilled in the art can easily adapt the hereafter examples to alternative circuits using either a PNP transistor, an NMOS or a PMOS transistor.

Transistor 40 is acting as a follower, with the input of the follower connected at the control terminal 43 and the output of the follower connected at the second main terminal 42. The Norton equivalent as seen from node 42 corresponds to an admittance $Y_N$ and a current $i_N = V22 \times GM_N$, with $GM_N$ the Norton equivalent transconductance. Regarding the above mentioned Norton equivalent of this follower transistor, it can be shown that $GM_N$ is equal to the transconductance of the transistor and that $Y_N$ is also equal the transconductance of the transistor plus the parasitic conductances and capacitances associated with the follower transistor 40 and its current sink. These parasitics will be considered as negligible in what follows. Equation (1.1) becomes:

$$\frac{V22}{Vi} = \frac{Y_1 Y_2}{Y_1 Y_2 + Y_3(Y_1 + Y_2) + Y_3 Y_4 \left(\frac{Y_N}{Y_N + Y_4}\right) + Y_2 Y_4 \left(\frac{Y_N - GM_N}{Y_N + Y_4}\right)} \quad (2.1)$$

where V22 is the potential of node 22 and Vi is the input potential.

The follower transistor also provides a current lo from node 41 whereby:

$$\frac{Io}{Vi} = \frac{V22}{Vi} \left[\frac{GM_N}{Y_N + Y_4}\right] \left[\frac{Y_3 Y_4}{Y_2} + GM_N - Y_N\right] \quad (2.2)$$

Figure 3:
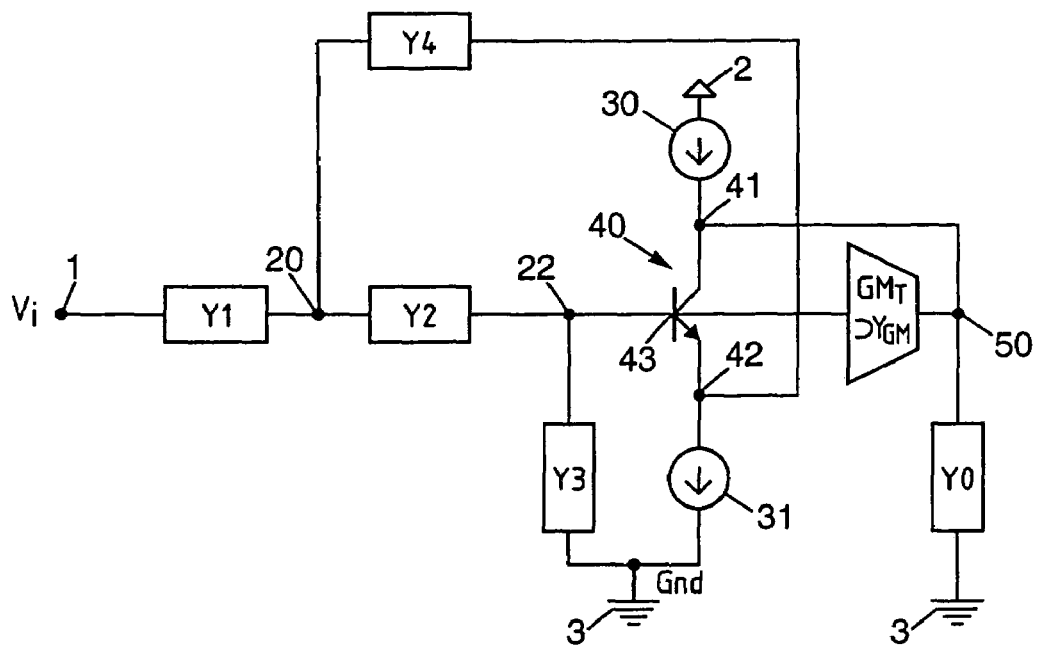
FIG. 3 is a structural circuit diagram of the general architecture of the biquad notch filter according to the invention.

The general architecture of a biquad notch filter according to one embodiment of the present invention is presented on FIG. 3. The architecture is similar to the modified Sallen-Key circuit shown in FIG. 2, and is completed as follows.

The resulting circuit of FIG. 3 comprises an input terminal 1 corresponding to a notch filter input terminal and an output terminal 50 corresponding to a notch filter output terminal.

A transconductance $GM_T$ is connected between node 22 and the output terminal 50. Node 41 is also connected to the output terminal 50. An output admittance Yo is placed between the output terminal 50 and the second power supply terminal 3, which is ground or any AC ground node for that matter. Transconductance $GM_T$ has a small input and output admittance. It is an active component and is constructed from a few transistors, including a NPN bipolar transistor, and comprises an admittance $Y_{GM}$. Thus, no current flows into the transconductance $GM_T$ from node 22 and its output current is independent of its output voltage. Both admittances Yo and $Y_{GM}$ are of the same type as admittances Y1 and Y2. A complete circuit of the transconductance $GM_T$ is well within the skill of the art in view of the discussion and equations that follow.

Therefore, in order to get the desired transfer function, the above mentioned current lo is added on the output terminal 50 to the current coming from the transconductance $GM_T$ (given by the voltage of node 22 multiplied by $GM_T$); the resulting current coming across the output admittance Yo, to produce the following transfer function (3) that takes into account the above mentioned transconductance characteristics:

$$\frac{Vo}{Vi} = \frac{V22}{Vi} \times \frac{\left[\frac{Y_0}{Y_1}\right]\left[Y_1 Y_2 \left(\frac{GM_T}{Y_1}\right)\left(\frac{Y_N}{Y_N + Y_4}\right) + Y_3 Y_4 \left(\frac{GM_N}{Y_N + Y_4}\right) + Y_2(GM_N - Y_N)\left(\frac{GM_N}{Y_N + Y_4}\right) + \frac{Y_2 Y_4 GM_T}{Y_N + Y_4}\right]}{Y_1 Y_2} \quad (3)$$

where V22 is the potential of node 22, Vi is the input potential and Vo is the output potential at output terminal 50 as seen in FIG. 3.

Transconductance $GM_T$ is chosen so that its overall value is given by the equation (3.1):

$$GM_T = \frac{gm_{NPN}(Y_{GM} + y_{par})}{gm_{NPN} + Y_{GM} + y_{par}} \approx Y_{GM} \quad (3.1)$$

where $Y_{GM}$ is the above mentioned admittance comprised in $GM_T$, $gm_{NPN}$ is the conductance of a bipolar NPN transistor of $GM_T$, and $y_{par}$ is the parasitic admittance in parallel with the target admittance $Y_{GM}$. As $gm_{NPN} \gg Y_{GM} \gg y_{par}$, the overall transconductance value of $G_{MT}$ is $Y_{GM}$. Equation (3) becomes:

$$\frac{Vo}{Vi} = \frac{V22}{Vi} \times \frac{\left[\frac{Y_0}{Y_1}\right]\left[Y_1 Y_2 \left(\frac{Y_{GM}}{Y_1}\right)\left(\frac{Y_N}{Y_N + Y_4}\right) + Y_3 Y_4 \left(\frac{GM_N}{Y_N + Y_4}\right) + Y_2(GM_N - Y_N)\left(\frac{GM_N}{Y_N + Y_4}\right) + \frac{Y_2 Y_4 Y_{GM}}{Y_N + Y_4}\right]}{Y_1 Y_2} \quad (3bis)$$

The transfer function (3bis) corresponding to the general architecture of the biquad notch filter of FIG. 3 will become clear with the two embodiments described hereafter. In the following, the classic complex variable approach is used with Y=g+sC, where Y is any admittance, g is a conductance, C is a capacitance, and s=jω with ω as the frequency.

Figure 4:
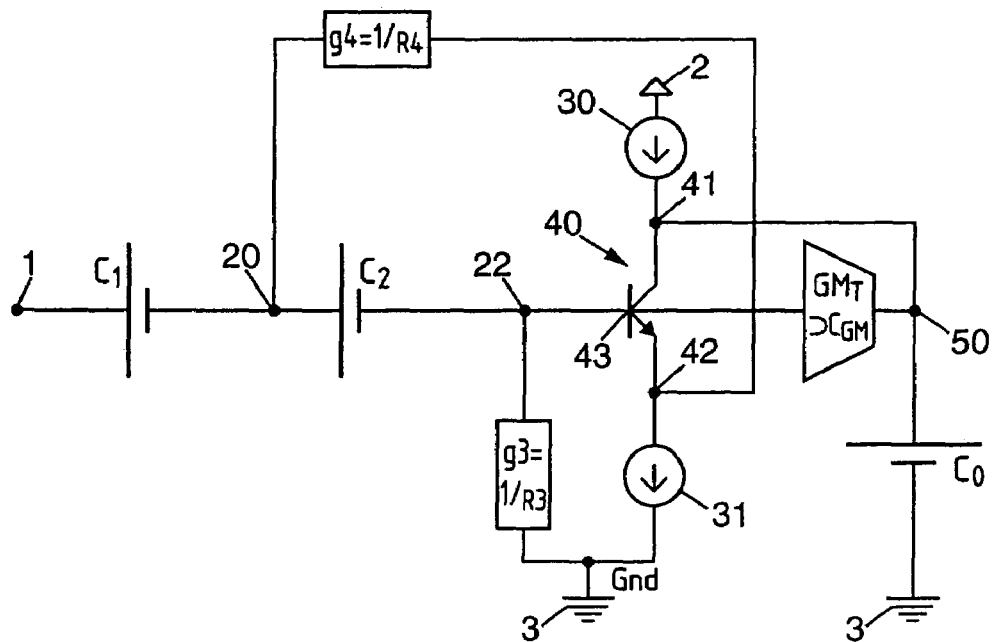
FIG. 4 is a structural circuit diagram of an example of a biquad notch filter according to the invention.

A first embodiment of a biquad notch filter according to the invention is presented on FIG. 4. The first type of admittance is a capacitance, while the second type is a conductance. Therefore, FIG. 4 shows capacitances C1, C2, and Co respectively for the admittances Y1, Y2, and Yo. Admittance $Y_{GM}$ contained in the transconductance $GM_T$ is also chosen as a capacitance $C_{GM}$. Furthermore, resistors R3 and R4 are the admittances Y3 and Y4 respectively and are considered through their inverse or related conductance g3=1/R3 and g4=1/R4. The follower transistor 40 is a bipolar NPN transistor as seen before, but could be as well any one of the above mentioned, provided the circuit is adapted accordingly. Admittance $Y_N$ is chosen equal to $GM_N$ as mentioned before. $Y_N$ is also chosen in order to ensure that $Y_N \gg Y4$ and Y2. This is done by increasing the biasing current through the NPN follower transistor 40 until the transconductance $GM_N$ of the NPN follower transistor is greater than admittances Y4 and Y2 at the frequencies of interest.

Applying these characteristics and the complex approach to the previous equations, equation (1.1) becomes equivalent to equation (2.1) and equation (3bis) becomes:

$$\frac{v_o}{v_i} = \left[\frac{C_1}{C_o}\right]\left[\frac{s^2 C_1 C_2 \left(\frac{C_{GM}}{C_1}\right) + g_3 g_4}{s^2 C_1 C_2 + g_3 s(C_1 + C_2) + g_3 g_4}\right] \quad (4.1)$$

the input admittance becomes:

$$Y_i = sC_1\left[\frac{g_3 g_4}{s^2 C_1 C_2 + g_3 s(C_1 + C_2) + g_3 g_4}\right] + \quad (4.2)$$

$$g_3\left[\frac{s^2 C_1 C_2}{s^2 C_1 C_2 + g_3 s(C_1 + C_2) + g_3 g_4}\right]$$

which leads to $Y_i \approx \frac{sC_1 g_3}{g_3 + sC_1}$

Using the following definitions:

$$K = \frac{C_1}{C_o}, \ |P| = \sqrt{\frac{g_3 g_4}{C_1 C_2}}, \ P_R = \frac{g_3}{2}\left(\frac{C_1 + C_2}{C_1 C_2}\right) \text{ and } |Z| = |P|\sqrt{\frac{C_1}{C_{GM}}}$$

equation (4.1) becomes the desired classic Notch biquad response in the following equation (5):

$$\frac{v_o}{v_i} = K\left[\frac{|P|^2}{s^2 + s2P_R + |P|^2}\right]\left[\frac{s^2 + |Z|^2}{|Z|^2}\right] \text{ where } P_R \equiv |P|\cos\theta \quad (5)$$

where P and Z are respectively the pole and zero of the biquad notch filter equation, and are functions of the circuit characteristics where θ is the angle of the pole in the Laplace plane representation, using the polar co-ordinates $|P|.e^{j\theta}$, and where |P| is the magnitude of P.

Advantageously, the poles and zeros are relatively simple functions of circuit elements.

Using the ratios $$Rc = \frac{C1}{C2} \text{ and } Rg = \frac{g3}{g4},$$

the circuit can be further simplified when Rc=1. Relation (6) is thus obtained:

$$R_g = \left[\frac{RC}{(R_c+1)^2}\right]\left[\frac{4}{1+\tan^2\theta}\right] \to \frac{1}{1+\tan^2\theta} \text{ for } R_c = 1 \quad (6)$$

Thus, having chosen |P| and θ, and |Z| based on the targeted notch filter characteristics, the biquad notch filter can be reconstructed using the following biquad design equations (7):

$$R_g = \frac{1}{1+\tan^2\theta}, \ C_2 = C_1, \ g_3 = C_1|P|\sqrt{R_g} \\ g_4 = \frac{g_3}{R_g}, \ C_o = \frac{C_1}{K} \text{ and } C_{GM} = C_1\left[\frac{|P|}{|Z|}\right]^2 \quad (7)$$

Knowing |P|, θ and C1, one can first define values for Rg, C2, g3 and g4. The capacitance $C_{GM}$ results from knowing C1, |P| and |Z|, which means that |Z| can be controlled by controlling $C_{GM}$ without changing |P| or θ. Therefore |Z| and |P| are independently controlled. Advantageously, the capacitance and/or conductance ratios are not too large.

In this configuration the biquad blocks DC and low frequency signals. To reduce the current consumption of the transconductance $GM_T$, it is more suitable where $|Z| \geq |P|$.

Since this circuit provides both a pair of zeros and a pair of poles, the conductances and capacitances can be interchanged while still realizing the classic Notch biquad response of equation (5).

Thus, a second embodiment of a biquad notch filter according to the invention can be deducted from FIG. 4, by changing all capacitances to conductances and all conductances to capacitances, respectively, i.e. introducing g1, g2, go, C3, C4 and $g_{MN}$. Applying these characteristics and the complex approach as before, equation (1.1) becomes equivalent to equation (2.1), equation (3bis) becomes the following (8.1):

$$\frac{v_o}{v_i} = \left[\frac{g_1}{g_o}\right]\left[\frac{s^2 C_3 C_4 + g_1 g_2\left(\frac{g_{GM}}{g_1}\right)}{s^2 C_3 C_4 + sC_3(g_1 + g_2) + g_1 g_2}\right] \quad (8.1)$$

and the input admittance becomes:

$$Y_i = g_1\left[\frac{s^2 C_3 C_4}{g_1 g_2 + sC_3(g_1+g_2) + s^2 C_3 C_4}\right] + \quad (8.2)$$

$$sC_3\left[\frac{g_1 g_2}{g_1 g_2 + sC_3(g_1+g_2) + s^2 C_3 C_4}\right]$$

which leads to $Y_i \approx \frac{g_1 sC_3}{sC_3 + g_1}$

Using the following definitions:

$$K = \frac{g_1}{g_o}, |P| = \sqrt{\frac{g_1 g_2}{C_3 C_4}}, P_R = \frac{g_1 g_2}{2C_4} \text{ and } |Z| = |P|\sqrt{\frac{g_{GM}}{g_1}}$$ (8.1)

equation (8.1) then maps equation (5).

Using the ratios $$Rc = \frac{C3}{C4} \text{ and } Rg = \frac{g_1}{g_2},$$

the circuit can be further simplified when Rg=1. Following equation (9) is thus obtained:

$$R_c = \left[\frac{R_g}{(R_g+1)^2}\right]\left[\frac{4}{1+\tan^2\theta}\right] \rightarrow \frac{1}{1+\tan^2\theta} \text{ for } R_g = 1$$ (9)

Thus, having chosen |P| and θ, and |Z| based on the targeted notch filter characteristics, the biquad notch filter can be reconstructed using the following biquad design equations (10):

$$R_c = \frac{1}{1+\tan^2\theta}, g_2 = g_1, C_3 = g_1\sqrt{\frac{R_c}{|P|}}$$
$$C_4 = \frac{C_3}{R_c}, g_o = \frac{g_1}{K} \text{ and } g_{GM} = g_1\left[\frac{|Z|}{|P|}\right]^2$$ (10)

Knowing |P|, θ and g1, one can first define values for Rc, g2, C3 and C4. Besides $g_{GM}$ results from knowing g1, |P| and |Z|, which means that |Z| can be controlled by controlling $g_{GM}$ without changing |P| or θ. Therefore |Z| and |P| are independently controlled.

In this configuration the biquad passes DC and low frequency signals, and is more suitable to cases where |Z|<|P|.

All the circuits displayed here before are single ended circuits for simplification purposes. The results remain valid for differential circuits, one positive circuit, with Vip being its input signal and Vop being its output signal, and one negative circuit, with Vin being its input signal and Von being its output signal. This does not impact the transfer function since it is the ratio of the difference in output Vop-Von to the difference in input Vip-Vin which is monitored to eliminate the common mode.

Figure 5A:
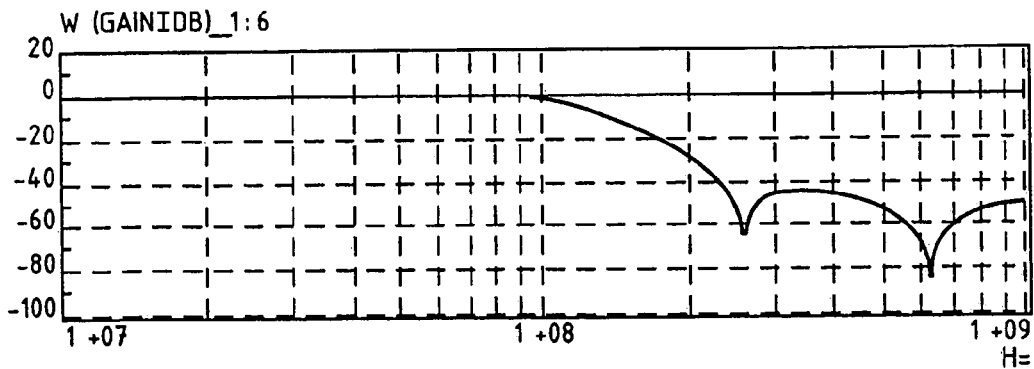
FIG. 5($a$) is a diagram showing the frequency response of an application of the notch biquad filter according to the invention to realize a 4th order Inverse Chebychev filter, with 2 notches.
Figure 5B:
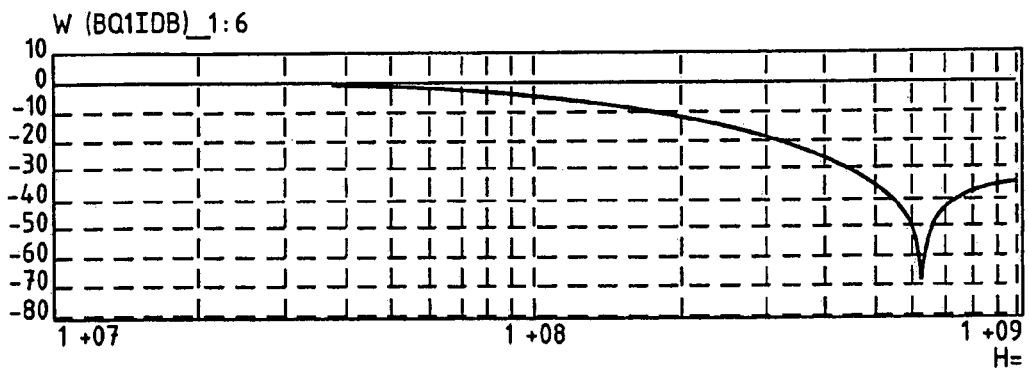
Figure 5C:
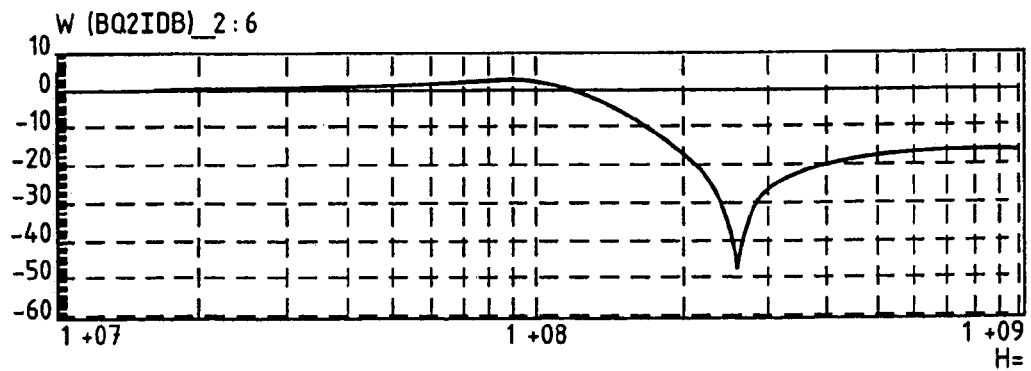

A typical example of an application of a biquad notch filter according to the invention is presented on FIG. 5(a) to 5(c). The 4th order Inverse Chebychev filter is presented in FIG. 5(a). The entire filter is constituted of 2 successive biquad filters whose responses are plotted on FIGS. 5(b) and 5(c) respectively. FIG. 5(b) corresponds to a first biquad notch filter where:

|Z|=2π627.1 MHz, θ=±90° for the two zeros,
|P|=2π114.7 MHz, θ=±24.73° for the two poles.

FIG. 5(c) corresponds to a second biquad notch filter with:
|Z|=2π259.8 MHz, θ=±90° for the two zeros,
|P|=2π106.5 MHz, θ=±69.57° for the two poles.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A biquad notch filter comprising:
   first and second power supply terminals;
   an input terminal;
   a transistor having a control terminal, and first and second main terminals;
   an output terminal;
   a first stage including first and second admittances of a first type connected to each other at a node and connected between said input terminal and the control terminal of said transistor, a first current source connected between said first power supply terminal and the first main terminal of said transistor, a second current source connected between the second main terminal of said transistor and said second power supply terminal; a third admittance of a second type connected between the control terminal of said transistor and said second power supply terminal; a fourth admittance of said second type connected between the node between said first and second admittances on one hand and said second main terminal of said transistor on another hand; and
   a second stage including a transconductance, which comprises a fifth admittance of said first type and which is connected between the control terminal of said transistor and said output terminal, a sixth admittance of said first type connected between said output terminal and said second power supply terminal, and a connection of said first main terminal of said transistor to said output terminal.

2. The biquad notch filter according to claim 1 wherein the admittances of the first type are capacitances and the admittances of the second type are conductances.

3. The biquad notch filter according to claim 1 wherein the admittances of the first type are conductances and the admittances of the second type are capacitances.

4. The biquad notch filter according to claim 1 wherein the transistor is a bipolar transistor.

5. The biquad notch filter according to claim 4 wherein the bipolar transistor is an NPN transistor having a collector as the first main terminal, an emitter as the second main terminal, and a base as the control terminal; the first power supply terminal delivers a positive DC voltage; and the second power supply terminal is ground.

6. The biquad notch filter according to claim 4 wherein the bipolar transistor is a PNP transistor having a collector as the first main terminal, an emitter as the second main terminal, and a base as the control terminal; the first power supply terminal is ground; and the second power supply terminal delivers a positive DC voltage.

7. The biquad notch filter according to claim 1 wherein the transistor is a MOS transistor.

8. The biquad notch filter according to claim 7 wherein the MOS transistor is an NMOS transistor having a drain as the first main terminal, a source as the second main terminal, and a gate as the control terminal; the first power supply terminal delivers a positive DC voltage and the second power supply terminal is ground.

9. The biquad notch filter according to claim 7 wherein the MOS transistor is a PMOS transistor having a drain as the first main terminal, a source as the second main terminal, and a gate as the control terminal; the first power supply terminal is ground; and the second power supply terminal delivers a positive DC voltage.

10. The biquad notch filter according to claim 1 wherein the first and second admittances are equal in values.

11. A biquad notch filter, comprising:
first and second power supply terminals;
an input terminal;
an output terminal;
first and second admittances of a first type connected to the input terminal and connected to one another at a first node;
third and fourth admittances of a second type, the third admittance being connected between the second power supply terminal and a second node connected to the second admittance, and the fourth admittance being connected to the first node;
a transistor having a control terminal connected to the second node, a first main terminal connected to the first power supply terminal, and a second main terminal connected to the fourth admittance; and
a transconductance connected between the control terminal of the transistor and the output terminal.

12. The biquad notch filter of claim 11, wherein the output terminal is connected to the first main terminal of the transistor.

13. The biquad notch filter of claim 12, further comprising a fifth admittance of the first type connected between the output terminal and the second power supply terminal.

14. The biquad notch filter of claim 12 wherein the transconductance includes a fifth admittance of the first type.

15. The biquad notch filter of claim 11 wherein the admittances of the first type are capacitances and the admittances of the second type are conductances.

16. The biquad notch filter of claim 11 wherein the admittances of the first type are conductances and the admittances of the second type are capacitances.

17. The biquad notch filter of claim 11 wherein the transistor is an NPN transistor having a collector as the first main terminal, an emitter as the second main terminal, and a base as the control terminal; the first power supply terminal delivers a positive DC voltage; and the second power supply terminal is ground.

18. The biquad notch filter of claim 11 wherein the transistor is a PNP transistor having a collector as the first main terminal, an emitter as the second main terminal, and a base as the control terminal; the first power supply terminal is ground; and the second power supply terminal delivers a positive DC voltage.

19. The biquad notch filter of claim 11 wherein the transistor is an NMOS transistor having a drain as the first main terminal, a source as the second main terminal, and a gate as the control terminal; the first power supply terminal delivers a positive DC voltage and the second power supply terminal is ground.

20. The biquad notch filter of claim 11 wherein the transistor is a PMOS transistor having a drain as the first main terminal, a source as the second main terminal, and a gate as the control terminal; the first power supply terminal is ground; and the second power supply terminal delivers a positive DC voltage.

21. The biquad notch filter of claim 11 wherein the first and second admittances are equal in values.

22. The biquad notch filter of claim 11, further comprising:
a first current source connected between the first power supply terminal and the first main terminal of the transistor; and
a second current source connected between the second main terminal of the transistor and the second power supply terminal.

23. A biquad notch filter, comprising:
first and second power supply terminals;
an input terminal;
an output terminal;
first and second admittances of a first type connected to the input terminal and connected to one another at a first node;
third and fourth admittances of a second type, the third admittance being connected between the second power supply terminal and a second node connected to the second admittance, and the fourth admittance being connected to the first node;
a transistor having a control terminal connected to the second node, a first main terminal connected to the first power supply terminal, and a second main terminal connected to the fourth admittance;
a transconductance, which comprises a fifth admittance of said first type and which is connected between the second node and the output terminal; and
a sixth admittance of the first type connected between the output terminal and the second power supply terminal.

24. The biquad notch filter of claim 23, wherein the first main terminal of the transistor is connected to the output terminal.

25. The biquad notch filter of claim 23, further comprising:
a first current source connected between the first power supply terminal and the first main terminal of the transistor; and
a second current source connected between the second main terminal of the transistor and the second power supply terminal.

26. The biquad notch filter of claim 23 wherein the transistor is an NPN transistor having a collector as the first main terminal, an emitter as the second main terminal, and a base as the control terminal; the first power supply terminal delivers a positive DC voltage; and the second power supply terminal is ground.

27. The biquad notch filter of claim 23 wherein the transistor is a PNP transistor having a collector as the first main terminal, an emitter as the second main terminal, and a base as the control terminal; the first power supply terminal is ground; and the second power supply terminal delivers a positive DC voltage.

28. The biquad notch filter of claim 23 wherein the transistor is an NMOS transistor having a drain as the first main terminal, a source as the second main terminal, and a gate as the control terminal; the first power supply terminal delivers a positive DC voltage and the second power supply terminal is ground.

29. The biquad notch filter of claim 23 wherein the transistor is a PMOS transistor having a drain as the first main terminal, a source as the second main terminal, and a gate as the control terminal; the first power supply terminal is ground; and the second power supply terminal delivers a positive DC voltage.

30. The biquad notch filter of claim 23 wherein the admittances of the first type are capacitances and the admittances of the second type are conductances.

31. The biquad notch filter of claim 23 wherein the admittances of the first type are conductances and the admittances of the second type are capacitances.

32. The biquad notch filter of claim 23 wherein the first and second admittances are equal in values.

* * * * *